United States Patent [19]

Isogami et al.

[11] Patent Number: 4,621,065

[45] Date of Patent: Nov. 4, 1986

[54] CHRYSOBERYL CAT'S-EYE SYNTHETIC SINGLE CRYSTAL

[75] Inventors: Mineo Isogami, Uji; Ryosuke Nakata, Kyoto, both of Japan

[73] Assignee: Kyocera Corporation, Kyoto, Japan

[21] Appl. No.: 653,950

[22] Filed: Sep. 21, 1984

[30] Foreign Application Priority Data

Sep. 24, 1983 [JP] Japan ............................... 58-176814

[51] Int. Cl.[4] ................... C04B 35/44; C30B 29/20; C30B 29/16
[52] U.S. Cl. .................................................. 501/86
[58] Field of Search ........................................ 501/86

[56] References Cited

U.S. PATENT DOCUMENTS 3,912,521 10/1975 Cline ..................................... 501/86
4,240,834 12/1980 Machida et al. .................... 501/86

FOREIGN PATENT DOCUMENTS 55-62884 5/1980 Japan ..................................... 501/86

Primary Examiner—Mark L. Bell
Attorney, Agent, or Firm—Spensley, Horn, Jubas & Lubitz

[57] ABSTRACT

Disclosed is a chrysoberyl cat's-eye synthetic single crystal, which comprises aluminum oxide and beryllium oxide as main component, and 0.005 to 1.050% by weight, based on the total crystal, of at least one member selected from oxides of iron, cerium, vanadium, cobalt, tungsten, chromium, nickel and manganese and 0.005 to 2.0% by weight, based on the total crystal, of at least one member selected from oxides of titanium, tin, zirconium and germanium.

This synthetic single crystal is comparable to natural cat's-eye in the physical properties, color tone and chatoyancy effect.

8 Claims, No Drawings

CHRYSOBERYL CAT'S-EYE SYNTHETIC SINGLE CRYSTAL

BACKGROUND OF THE INVENTION (1) Field of the Invention

The present invention relates to a synthetic jewel crystal. More particularly, the present invention relates to a chrysoberyl cat's-eye synthetic single crystal in which the physical characteristics and chatoyancy effect (cat's eye effect) of natural cat's-eye are reproduced.

(2) Description of the Prior Art

When light is incident in natural cat's-eye, a straight white bright line is caused to appear on the surface by the reflecting and refracting actions of inclusions in the crystal. The width of this white bright line is changed with the change of the illuminance of the incident light as in case of the pupil of an eye of a cat. Accordingly, cat's-eye is highly esteemed as a jewel.

The output of natural cat's-eye is very small. Accordingly, products obtained by embedding a foil of a metal such as aluminum in a matrix such as a synthetic resin or glass so that a straight white bright line is formed on the surface by the reflecting action of the metal foil have been provided as substitutes for natural cat's-eye.

In these substitutes, when light is incident, a straight white bright line is formed on the surface, but the change of the width of the white bright line (cat's-eye effect) with the change of the illuminance of the incident light is hardly caused. Moreover, since the hardness (Mohs hardness) of the glass or synthetic resin as the matrix is about 6 and the matrix is much softer than natural cat's-eye having a hardness (Mohs hardness) of 8.5, the surface is readily scratched or damaged and these substitutes cannot be regarded as being equivalent to natural cat's-eye in the physical characteristics and cat's eye effect.

SUMMARY OF THE INVENTION

Under this background we made research and as the result, we found that if at least one member selected from oxides, of iron, cerium, vanadium, cobalt, tungsten, chromium, nickel and manganese and at least one member selected from oxides of titanium, tin, zirconium and germanium are added to aluminum oxide and beryllium as main components, a grown chrysoberyl cat's-eye synthetic single crystal is comparable to natural cat's-eye in the physical characteristics, color tone and cat's-eye effect to such an extent that this single crystal can hardly be discriminated from natural cat's-eye. We have now completed the present invention based on this finding.

More specifically, in accordance with the present invention, there is provided a chrysoberyl cat's-eye synthetic single crystal, which comprises aluminum oxide and beryllium oxide as main components, and 0.005 to 1.050% by weight, based on the total crystal, of at least one member selected from oxides of iron, cerium, vanadium, cobalt, tungsten, chromium, nickel and manganese and 0.005 to 2.0% by weight, based on the total crystal, of at least one member selected from oxides of titanium tin, zirconium and germanium.

DETAILED DESCRIPTION OF THE PREFERRED EMBODIMENTS

In the present invention, a known method for forming a single crystal may be adopted. For example, there can be mentioned a so-called flux method in which the starting material is melted by using a flux and a single crystal is grown on a seed crystal while gradually cooling the melt from the super-saturated state, and a direct melting method not using a flux. As the direct melting method, there can be mentioned a Czochralski method (rotational pull-up method), a Bridgman method and a Verneuil method.

A natural chrysoberyl crystal or a seed crystal formed by cutting a synthetic crystal along a predetermined azimuth may be used as the seed crystal in the method for forming a single crystal.

The main components of the chrysoberyl cat's-eye synthetic single crystal of the present invention are aluminum oxide ($Al_2O_3$) and beryllium oxide (BeO). An oxide or iron, cerium, vanadium, cobalt, tungsten, chromium, nickel or manganese is added as a coloring component for imparting to the synthetic single crystal a color tone comparable to that of natural cat's-eye, and an oxide of titanium, tin, zirconium or germanium is added as a component for imparting a cat's-eye effect to the synthetic single crystal.

Aluminum oxide and beryllium oxide as the main components should be present in such quantities as capable of forming a chrysoberyl crystal. It is generally preferred that aluminum oxide be present in an amount of 79.5 to 81.8% by weight based on the total crystal and beryllium oxide be present in an amount of 18.2 to 21.5% by weight based on the total crystal.

In order to impart the physical properties, color tone and cat's-eye effect possessed by natural cat's-eye to the chrysoberyl cat's-eye synthetic single crystal of the present invention, it is indispensable that 0.005 to 1.050% by weight, based on the total crystal, of at least one member selected from oxides of iron, cerium, vanadium, cobalt, tungsten, chromium, nickel and manganese and 0.005 to 2.0% by weight, based on the total crystal, of at least one member selected from oxides of titanium, tin, zirconium and germanium should be incorporated into the single crystal.

If the content of the coloring component selected from oxides of iron, cerium, vanadium, cobalt, tungsten, chromium, nickel and manganese is lower than 0.005% by weight, coloration of the single crystal is insufficient and the color tone is faint. If the content of the coloring component is higher than 1.050% by weight, coloration becomes excessive and the color tone is dense. In each case, the color tone of the single crystal is quite different from that of natural cat's-eye, and the value of the single crystal as a chrysoberyl cat's-eye synthetic jewel is drastically reduced.

If the content of the cat's-eye effect-imparting component selected from oxides of titanium, tin, zirconium and germanium is lower than 0.005% by weight or higher than 2.0% by weight, a desired cat's-eye effect cannot be manifested on the surface of the single crystal, and the single crystal has no value as a cat's eye synthetic jewel.

Namely, in order to obtain desired color tone and cat's eye effect, it is indispensable that the coloring component and cat's eye effect-imparting component should be incorporated in the above-mentioned appropriate amounts.

In the case where 0.005 to 1.050% by weight of at least one member selected from oxides of iron, cerium, vanadium, cobalt, tungsten, chromium, nickel and manganese as the coloring component and 0.005 to 2.0% by weight of at least one meber selected from oxides of titanium, tin, zirconium and germanium as the cat's eye effect-imparting component are incorporated into aluminum oxide and beryllium oxide as the main components as in the present invention, the grown single crystal forms chrysoberyl and the hardness (Mohs hardness) of the single crystal is very high and 8.0 or more. Moreover, the single crystal shows a wine color, an olive green color, a green color, a yellowish green color or a light purple color and a white bright line, the width of which is changed according to the illuminance of the incident light, is formed on the surface of the single crystal. Thus, according to the present invention, there can be provided a chrysoberyl cat's-eye synthetic jewel which is quite similar to natural cat's-eye and has a very high commercial value.

The above-mentioned prominent advantages of the present invention will become apparent from the following Examples and Comparative Examples. As is apparent from the examples, the ratio of $Al_2O_3$ to BeO is approximately 4:1.

EXAMPLE 1

| Components | Contents (% by weight) |
| --- | --- |
| Aluminum oxide ($Al_2O_3$) | 80.13 |
| Beryllium oxide (BeO) | 18.72 |
| Vanadium oxide ($V_2O_5$) | 0.10 |
| Iron oxide ($Fe_2O_3$) | 0.05 |
| Titanium oxide ($TiO_2$) | 1.00 |

A composition comprising the above components was placed in a crucible having a diameter of 50 mm, and the crucible was set in an induction-melting apparatus. The crucible was heated to about 1870° C. while diffusing an inert gas in a quartz tube and this temperature was maintained for 1 hour.

A natural chrysoberyl seed crystal was thrown into the melt and the seed crystal was pulled up at a speed of 3.0 mm/hr while rotating it at 70 rpm to grow a single crystal having a diameter of 25 mm and a length of 150 mm. The hardness of the so-obtained single crystal was 8.7 as measured by a Mohs hardness meter. When the single crystal was analyzed by the atomic-absorption spectro-chemical analysis, it was found that the single crystal containing 0.069% by weight of vanadium oxide, 0.007% by weight of iron oxide and 0.656% by weight of titanium oxide. The single crystal had a green color and when the single crystal was subjected to cabochon cutting, a straight white bright line, the width of which was greatly changed according to the illuminance of incident light, appeared on the surface of the single crystal. It was found that this single crystal was comparable to natural cat's-eye in the physical properties, color tone and cat's eye effect.

EXAMPLE 2

| Components | Contents (% by weight) |
| --- | --- |
| Aluminum oxide ($Al_2O_3$) | 79.06 |
| Beryllium oxide (BeO) | 18.60 |
| Vanadium oxide ($V_2O_5$) | 0.20 |
| Chromium oxide ($Cr_2O_3$) | 0.60 |
| Titanium oxide ($TiO_2$) | 1.00 |

A single crystal was grown from a melt of a composition comprising the above components in the same manner as described in Example 1. The obtained single crystal had a Mohs hardness of 8.5, and from the results of the atomic-absorption spectro-chemical analysis, it was found that the single crystal contained 0.134% by weight of vanadium oxide, 0.397% by weight of chromium oxide and 0.590% by weight of titanium oxide.

This single crystal had a yellowish green color, and when the single crystal was subjected to cabochon cutting, a cat's eye effect was mainfested on the surface of the single crystal as in Example 1. It was confirmed that the single crystal was comparable to natural cat's-eye and it had a sufficiently high commercial value as a synthetic jewel crystal.

EXAMPLE 3

| Components | Contents (% by weight) |
| --- | --- |
| Aluminum oxide ($Al_2O_3$) | 80.17 |
| Beryllium oxide (BeO) | 18.73 |
| Tungsten oxide ($WO_3$) | 0.10 |
| Titanium oxide ($TiO_2$) | 1.00 |

A single crystal was grown from a melt of a composition comprising the above components in the same manner as described in Example 1. The single crystal had a hardness comparable to that of the single crystal obtained in Example 1. From the results of the atomic-absorption spectro-chemical analysis, it was found that the single crystal contained 0.053% by weight of tungsten oxide and 0.634% by weight of titanium oxide. The single crystal had a light purple color. A cat's eye effect comparable to that of natural cat's-eye was manifested on the surface of the single crystal, and it was confirmed that the single crystal had a sufficiently high commercial value as a synthetic jewel crystal.

EXAMPLE 4

| Components | Contents (% by weight) |
| --- | --- |
| Aluminum oxide ($Al_2O_3$) | 78.86 |
| Beryllium oxide (BeO) | 19.34 |
| Chromium oxide ($Cr_2O_3$) | 0.10 |
| Titanium oxide ($TiO_2$) | 0.80 |

A single crystal was grown from a melt of a composition comprising the above components in the same manner as described in Example 1. The obtained single crystal had a hardness comparable to that of the single crystal obtained in Example 1. From the results of the atomic-absorption spectro-chemical analysis, it was found that the single crystal contained 0.065% by weight of chromium oxide and 0.459% by weight of titanium oxide. The single crystal and a wine color and when the single crystal was subjected to cabochon cutting, a cat's eye effect comparable to that of natural cat's-eye was manifested on the surface of the single crystal. Thus, it was confirmed that the single crystal had a very high commercial value.

EXAMPLE 5

| Components | Contents (% by weight) |
| --- | --- |
| Aluminum oxide ($Al_2O_3$) | 78.07 |
| Beryllium oxide (BeO) | 19.68 |

-continued

| Components | Contents (% by weight) |
| --- | --- |
| Iron oxide (Fe$_2$O$_3$) | 0.05 |
| Vanadium oxide (V$_2$O$_5$) | 0.2 |
| Titanium oxide (TiO$_2$) | 2.0 |

95.5% by weight of lithium molybdate (Li$_2$MoO$_4$) was added as a flux to 4.5% by weight of a composition comprising the above components, and the mixture was heated at about 1300° C. to form a melt. The melt was gradually cooled at a slow temperature gradient and a natural chrysoberyl seed crystal was set in the melt to grow a single crystal on the seed crystal during the gradual cooling. The Mohs hardness of the obtained single crystal was 8.7. From the results of the atomic-absorption spectro-chemical analysis, it was found that the single crystal contained 0.005% by weight of iron oxide, 0.487% by weight of vanadium oxide and 0.697% by weight of titanium oxide. The single crystal had an olive green color, and when the single crystal was subjected to cabochon cutting, a cat's eye effect comparable to that of natural cat's-eye was manifested on the surface of the single crystal.

EXAMPLE 6

| Components | Contents (% by weight) |
| --- | --- |
| Aluminum oxide (Al$_2$O$_3$) | 79.10 |
| Beryllium oxide (BeO) | 19.40 |
| Manganese oxide (MnO$_2$) | 0.5 |
| Germanium oxide (GeO$_2$) | 1.0 |

A single crystal was grown from a melt of a composition comprising the above components in the same manner as described in Example 5. The obtained single crystal had a Mohs hardness of 8.5. From the results of the atomic-absorption spectro-chemical analysis, it was found that the single crystal contained 0.135% by weight of manganese oxide and 0.482% by weight of germanium oxide. The single crystal had a brown color, and a cat's eye effect comparable to that of natural cat's-eye was manifested on the surface of the single crystal.

EXAMPLE 7

| Components | Contents (% by weight) |
| --- | --- |
| Aluminum oxide (Al$_2$O$_3$) | 79.10 |
| Beryllium oxide (BeO) | 19.40 |
| Nickel oxide (NiO) | 0.50 |
| Germanium oxide (GeO$_2$) | 1.00 |

A single crystal was grown from a melt of a composition comprising the above components in the same manner as described in Example 1. The obtained single crystal had a Mohs hardness of 8.3. From the results of the atomic-absorption spectro-chemical analysis, it was found that the single crystal contained 0.196% by weight of nickel oxide and 0.469% by weight of germanium oxide. The single crystal had a yellow color. When the single crystal was subjected to cabochon cutting, a cat's eye effect comparable to that of natural cat's-eye was manifested on the surface of the single crystal.

EXAMPLE 8

| Components | Contents (% by weight) |
| --- | --- |
| Aluminum oxide (Al$_2$O$_3$) | 79.10 |
| Beryllium oxide (BeO) | 19.40 |
| Cobalt oxide (CoO) | 0.50 |
| Tin oxide (SnO$_2$) | 1.0 |

A single crystal was grown from a melt of a composition comprising the above components in the same manner as described in Example 1. The obtained single crystal had a Mohs hardness of 8.4. From the results of atomic-absorption spectro-chemical analysis, it was found that the single crystal contained 0.205% by weight of cobalt oxide and 0.587% by weight of tin oxide. The single crystal had a yellow color and a cat's eye effect comparable to that of natural cat's-eye was manifested on the surface of the single crystal.

EXAMPLE 9

| Components | Contents (% by weight) |
| --- | --- |
| Aluminum oxide (Al$_2$O$_3$) | 79.26 |
| Beryllium oxide (BeO) | 19.44 |
| Cerium oxide (CeO$_2$) | 0.3 |
| Zirconium oxide (ZrO$_2$) | 1.0 |

A single crystal was grown from a melt of a composition comprising the above components in the same manner as described in Example 5. The obtained single crystal had a Mohs hardness of 8.5. From the results of the atomic-absorption spectro-chemical analysis, it was found that the single crystal contained 0.102% by weight of cerium oxide and 0.451% by weight of zirconium oxide. The single crystal had a yellowish green color, and when the single crystal was subjected to cabochon cutting, a cat's eye effect comparable to that of natural cat's-eye was manifested on the surface of the single crystal.

EXAMPLE 10

| Components | Contents (% by weight) |
| --- | --- |
| Aluminum oxide (Al$_2$O$_3$) | 79.60 |
| Beryllium oxide (BeO) | 18.60 |
| Cerium oxide (CeO$_2$) | 0.30 |
| Germanium oxide (GeO$_2$) | 1.00 |
| Zirconium oxide (ZrO$_2$) | 0.50 |

A single crystal was grown from a melt of a composition comprising the above components in the same manner as described in Example 1. The obtained single crystal had a Mohs hardness of 8.4. From the results of the atomic-absorption spectro-chemical analysis, it was found that the single crystal contained 0.094% by weight of cerium oxide, 0.451% by weight of germanium oxide and 0.161% by weight of zirconium oxide. The single crystal had a yellowish green color. When the single crystal was subjected to cabochon cutting, a cat's eye effect comparable to that of natural cat's-eye was manifested on the surface of the single crystal.

COMPARATIVE EXAMPLE 1

| Components | Contents (% by weight) |
|---|---|
| Aluminum oxide (Al$_2$O$_3$) | 80.24 |
| Beryllium oxide (BeO) | 18.75 |
| Vanadium oxide (V$_2$O$_5$) | 0.01 |
| Titanium oxide (TiO$_2$) | 1.0 |

A single crystal was grown from a melt of a composition comprising the above components in the same manner as described in Example 1. The obtained single crystal had a Mohs hardness of 8.2. From the results of the atomic-absorption spectro-chemical analysis, it was found that the single crystal contained 0.0048% by weight of vanadium oxide and 0.656% by weight of titanium oxide.

Although the single crystal had a green color, the density of the color was very low and the color tone of the single crystal was considerably different from that of natural cat's-eye. Accordingly, the single crystal had no commercial value.

COMPARATIVE EXAMPLE 2

| Components | Contents (% by weight) |
|---|---|
| Aluminum oxide (Al$_2$O$_3$) | 80.89 |
| Beryllium oxide (BeO) | 18.91 |
| Vanadium oxide (V$_2$O$_5$) | 0.1 |
| Iron oxide (Fe$_2$O$_3$) | 0.05 |
| Titanium oxide (TiO$_2$) | 0.05 |

A single crystal was grown from a melt of a composition comprising the above components in the same manner as described in Example 1. The obtained single crystal had a Mohs hardness of 8.5. From the results of the atomic-absorption spectro-chemical analysis, it was found that the single crystal contained 0.067% by weight of vanadium oxide, 0.007% by weight of iron oxide and 0.0045% by weight of titanium oxide.

Although this single crystal had a green color, a white bright line did not appear on the surface of the single crystal and no cat's eye effect was obtained.

When the results obtained in the foregoing Examples are compared with the results obtained in the Comparative Examples, it will readily be understood that if at least one member selected from oxides of iron, cerium, vanadium, cobalt, tungsten, chromium, nickel and manganese and at least one member selected from oxides of titanium, tin, zirconium and germanium are added in appropriate amounts to aluminum oxide and beryllium oxide to the present invention, a chrysoberyl cat's-eye synthetic single crystal comparable to natural cat's-eye in the physical properties, color tone and cat's eye effect is obtained and a synthetic jewel having a very high commercial value can be provided.

The chrysoberyl cat's-eye synthetic single crystal of the present invention is not limited to the foregoing Examples, but various changes, substitutions and additions can be made within the scope defined by the appended claims.

We claim:

1. A chrysoberyl cat's-eye synthetic single crystal, which consists essentially of 79.5 to 81.8% by weight, based on the total crystal, of aluminum oxide, 18.2 to 21.5% by weight, based on the total crystal, of beryllium oxide, 0.005 to 1.050% by weight, based on the total crystal, of at least one member selected from the oxide of iron, cerium, vanadium, cobalt, tungsten, chromium, nickel and manganese, and 0.005 to 2.0% by weight, based on the total crystal, of at least one member selected from oxides of tin, zirconium and germanium.

2. A chrysoberyl cat's-eye synthetic single crystal, which consists essentially of 79.5 to 81.8% by weight, based on the total crystal, of aluminum oxide, 18.2 to 21.5% by weight, based on the total crystal, of beryllium oxide, 0.005 to 1.050% by weight, based on the total crystal, of at least one member selected from oxides of iron, cerium, vanadium, cobalt, tungsten, chromium, nickel and manganese, and 0.005 to 2.0% by weight, based on the total crystal, of at least one member selected from oxides of titanium, tin, zirconium and germanium, wherein there is present about 0.053% by weight of tungsten oxide and about 0.634% by weight of titanium oxide.

3. A chrysoberyl cat's-eye synthetic single crystal, which consists essentially of 79.5 to 81.8% by weight, based on the total crystal, of aluminum oxide, 18.2 to 21.5% by weight, based on the total crystal, of beryllium oxide, 0.005 to 1.050% by weight, based on the total crystal, of at least one member selected from oxides of iron, cerium, vanadium, cobalt, tungsten, chromium, nickel and manganese, and 0.005 to 2.0% by weight, based on the total crystal, of at least one member selected from oxides of titanium, tin, zirconium and germanium, wherein there is present about 0.135% by weight of manganese oxide and about 0.482% by weight of germanium oxide.

4. A chrysoberyl cat's-eye synthetic single crystal, which consists essentially of 79.5 to 81.8% by weight, based on the total crystal, of aluminum oxide, 18.2 to 21.5% by weight, based on the total crystal, of beryllium oxide, 0.005 to 1.050% by weight, based on the total crystal, of at least one member selected from oxides of iron, cerium, vanadium, cobalt, tungsten, chromium, nickel and manganese, and 0.005 to 2.0% by weight, based on the total crystal, of at least one member selected from oxides of titanium, tin, zirconium and germanium, wherein there is present about 0.196% by weight of nickel oxide and about 0.469% by weight of germanium oxide.

5. A chrysoberyl cat's-eye synthetic single crystal, which consists essentially of 79.5 to 81.8% by weight, based on the total crystal, of aluminum oxide, 18.2 to 21.5% by weight, based on the total crystal, of aluminun oxide, 18.2 to 21.5% by weight, based on the total crystal, of beryllium oxide, 0.005 to 1.050% by weight, based on the total crystal, of at least one member selected from oxides of iron, cerium, vanadium, cobalt, tungsten, chromium, nickel and manganese, and 0.005 to 2.0% by weight, based on the total crystal, of at least one member selected from oxides of titanium, tin, zirconium and germanium, wherein there is present about 0.205% by weight of cobalt oxide and about 0.587% by weight of tin oxide.

6. A chyrsoberyl cat's-eye synthetic single crystal, which consists essentially of 79.5 to 81.8% by weight, based on the total crystal, of aluminum oxide, 18.2 to 21.5% by weight, based on the total crystal, of beryllium oxide, 0.005 to 1.050% by weight, based on the total crystal, of at least one member selected from oxides of iron, cerium, vanadium, cobalt, tungsten, chromium, nickel and manganese, and 0.005 to 2.0% by weight, based on the total crystal, of at least one member selected from oxides of titanium, tin, zirconium and germanium, wherein there is present about 0.102% by weight cerium oxide and about 0.451% by weight of zirconium oxide.

7. A chrysoberyl cat's-eye synthetic single crystal, which consists essentially of 79.5 to 81.8% by weight, based on the total crystal, of aluminum oxide, 18.2 to 21.5% by weight, based on the total crystal, of beryllium oxide, 0.005 to 1.050% by weight, based on the total crystal, of at least one member selected from oxides of iron, cerium, vanadium, cobalt, tungsten, chromium, nichel and manganese, and 0.005 to 2.0% by weight, based on the total crystal, of at least one member selected from oxides of titanium, tin, zirconium and germanium, wherein there is present about 0.094% by weight of cerium oxide, about 0.451% by weight of germanium oxide and about 0.161% by weight of zirconium oxide.

8. A synthetic cat's-eye single crystal consisting essentially of a major amount of aluminum oxide and a minor amount of beryllium oxide in approximately a 4:1 ratio and from about 0.005 to about 1.050% by weight, based on the total crystal, of at least one member selected from oxides of iron, cerium, vanadium, cobalt, tungsten, chromium, nickel and manganese and from about 0.005 to about 2.0% by weight, based on the total crystal, of at least one member selected from oxides of tin, zirconium and germanium.

* * * * *